United States Patent

Yamasaki et al.

[11] Patent Number: 5,885,747
[45] Date of Patent: *Mar. 23, 1999

[54] CHARGED BEAM LITHOGRAPHY METHOD

[75] Inventors: Satoshi Yamasaki, Yokohama; Shuichi Tamamushi; Hirohito Anze, both of Kawasaki, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 703,429

[22] Filed: Aug. 26, 1996

[30] Foreign Application Priority Data

Aug. 25, 1995 [JP] Japan .................................. 7-217554

[51] Int. Cl.$^6$ ........................................................ G03C 5/00
[52] U.S. Cl. ........................................ 430/296; 430/942
[58] Field of Search ................................. 430/327, 296, 430/942

[56] References Cited

U.S. PATENT DOCUMENTS 5,305,225  4/1994  Yamaguchi et al. .................. 364/474
5,458,998  10/1995  Takekuma et al. ........................ 430/5
5,565,285  10/1996  Takekuma et al. ........................ 430/5

FOREIGN PATENT DOCUMENTS 58-200238  11/1983  Japan .
4-344644  12/1992  Japan .

OTHER PUBLICATIONS

Sohn et al., "Comparative Study on Optical Proximity Effect Correction iwth Various Types of Dummy Patterns and its Application to DRAM Devices", Technical Rpt. of Samsung Elec.

Primary Examiner—John A. McPherson
Assistant Examiner—Rosemary Ashton
Attorney, Agent, or Firm—Foley & Lardner

[57] ABSTRACT

A charged beam lithography method comprising the method steps shown in the Figure below.

6 Claims, 15 Drawing Sheets

| | | |
|---|---|---|
| 0 1 | 0 1 | ←AUX. PATTERN ID CODE 102 |
| 4 0 0 | | ←IRRADIATE TIME |
| 0.1 2 5 | | ←FIGURE POSITION X |
| 0.1 2 5 | | ←FIGURE POSITION Y |
| 1.0 | | ←FIGURE SIZE X |
| 1.0 | | ←FIGURE SIZE Y |
| 0 1 | 0 2 | |
| 8 0 0 | | |
| 0.0 | | |
| 0.0 | | |
| 0.2 5 | | |
| 0.1 2 5 | | |
| 0 1 | 0 2 | |
| 8 0 0 | | |
| 0.0 | | |
| 0.1 2 5 | | |
| 0.1 2 5 | | |
| 0.1 2 5 | | |

PATTERN (1), PATTERN (2), PATTERN (3), PATTERN (4)

PATTERN NUMBERS CORRESPOND TO PATTERN NUMBERS SHOWN IN FIG. 11

PATTERN EXPOSURE DATA 1

PATTERN (1)
| Value | Field |
|---|---|
| 1 | FRAME NUMBER |
| 1 | SUB-FIELD NUMBER |
| 0.0 | SUB-FIELD POSITION X |
| 0.0 | SUB-FIELD POSITION Y |
| 0 1 | PATTERN CODE |
| 4 0 0 | IRRADIATION TIME |
| 2.0 | FIGURE POSITION X |
| 2.0 | FIGURE POSITION Y |
| 1.0 | FIGURE SIZE X |
| 1.0 | FIGURE SIZE Y |

F I G. 1 3 A

PATTERN EXPOSURE DATA 2

| Value | Field |
|---|---|
| 1 | FRAME NUMBER |
| 1 | SUB-FIELD NUMBER |
| 0.0 | SUB-FIELD POSITION X |
| 0.0 | SUB-FIELD POSITION Y |

PATTERN (2)
| Value | Field |
|---|---|
| 0 1 | PATTERN CODE |
| 8 0 0 | IRRADIATE TIME |
| 0.0 | FIGURE POSITION X |
| 0.0 | FIGURE POSITION Y |
| 0.2 5 | FIGURE SIZE X |
| 0.1 2 5 | FIGURE SIZE Y |

PATTERN (3)
| Value | Field |
|---|---|
| 0 1 | PATTERN CODE |
| 8 0 0 | IRRADIATE TIME |
| 0.0 | |
| 0.1 2 5 | |
| 0.1 2 5 | |
| 0.1 2 5 | |

F I G. 1 3 B

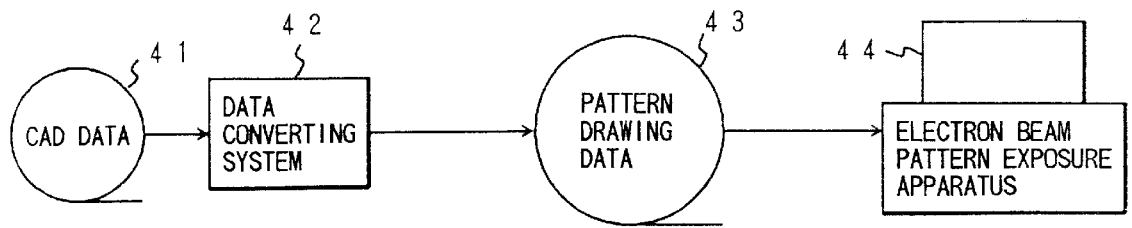
F I G. 1 4 A
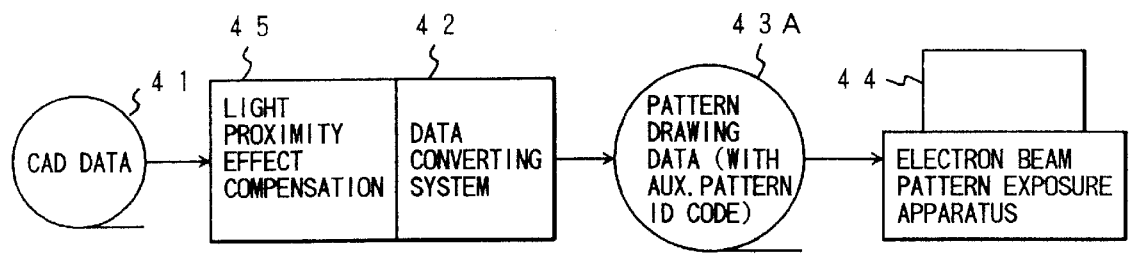
F I G. 1 4 B
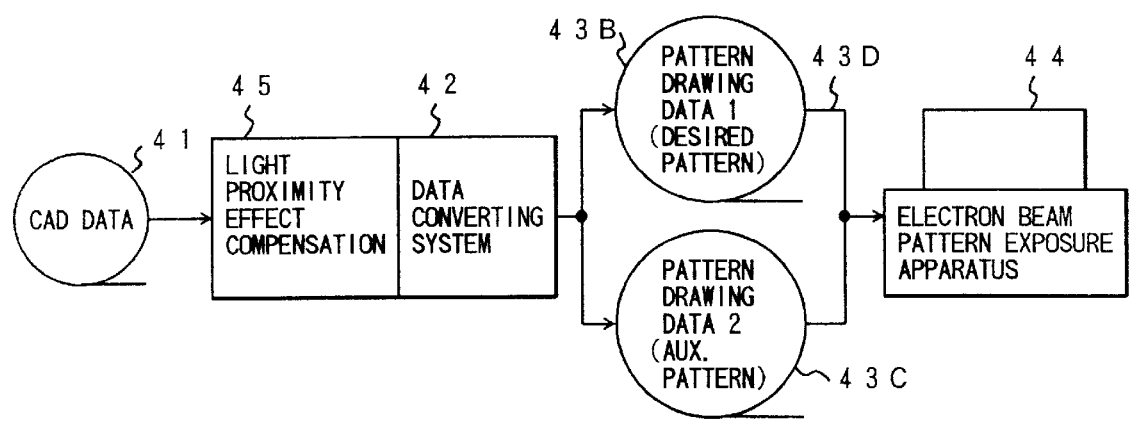
F I G. 1 4 C
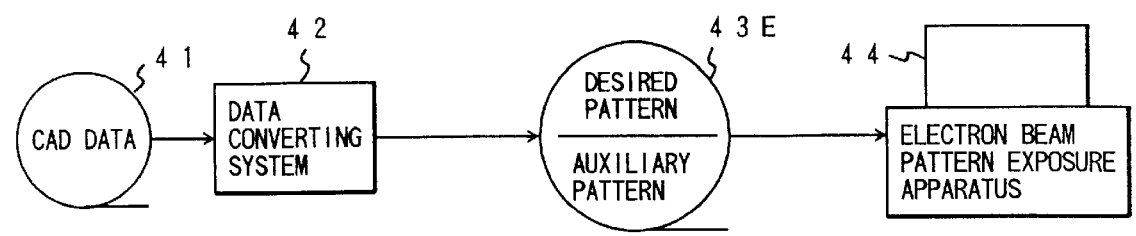
F I G. 1 4 D

PATTERN (1)
| 0 1 | 0 1 |
|---|---|
| 4 0 0 ||
| 0.1 2 5 ||
| 0.1 2 5 ||
| 1.0 ||
| 1.0 ||

PATTERN (2)
| 0 1 | 0 2 |
|---|---|
| 8 0 0 ||
| 0.0 ||
| 0.0 ||
| 0.2 5 ||
| 0.1 2 5 ||
| 0 1 | 0 2 |
| 8 0 0 ||
| 0.0 ||
| 0.0 ||
| 0.2 5 ||
| 0.1 2 5 ||

PATTERN (3)
| 0 1 | 0 2 |
|---|---|
| 8 0 0 ||
| 0.0 ||
| 0.1 2 5 ||
| 0.1 2 5 ||
| 0.1 2 5 ||
| 0 1 | 0 2 |
| 8 0 0 ||
| 0.0 ||
| 0.1 2 5 ||
| 0.1 2 5 ||
| 0.1 2 5 ||
| 0 1 | 0 2 |

FIG. 15A

| 0 1 | 0 1 |
|---|---|
| 4 0 0 ||
| 0.1 2 5 ||
| 0.1 2 5 ||
| 1.0 ||
| 1.0 ||
| 0 1 | 0 2 |
| 8 0 0 ||
| 0.0 ||
| 0.0 ||
| 0.2 5 ||
| 0.1 2 5 ||
| 0 1 | 0 2 |
| 8 0 0 ||
| 0.0 ||
| 0.1 2 5 ||
| 0.1 2 5 ||
| 0.1 2 5 ||

FIG. 15B

AUXILIARY PATTERN
(TWICE FORMATIONS)
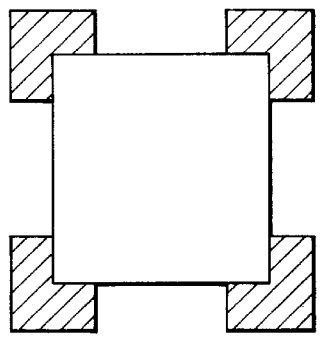
DESIRED PATTERN
(SINGLE FORMATION)
AUXILIARY PATTERN
(TWICE FORMATIONS)
FIG. 16
FIRST DRAWING
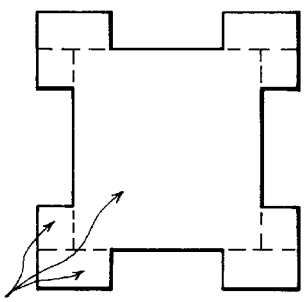
SHOTS
9 SHOTS
SECOND TO N-TH DRAWING
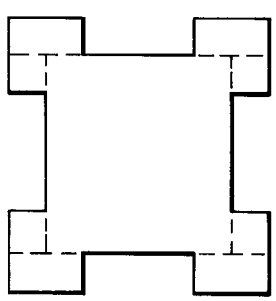
9 x (N-1) SHOTS
FIG. 17A
PRIOR ART
FIRST DRAWING
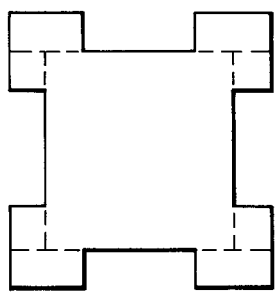
9 SHOTS
SECOND TO N-TH DRAWING
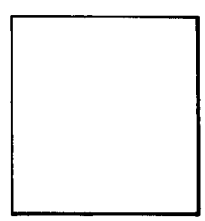
1 x (N-1) SHOTS
FIG. 17B

CHARGED BEAM LITHOGRAPHY METHOD

BACKGROUND OF THE INVENTION

The present invention relates to a charged beam lithography method and apparatus for drawing a desired pattern, and more specifically to a method and apparatus for drawing a microscopic pattern such as a semiconductor integrated circuit pattern, etc., on a semiconductor substrate, such as a semiconductor wafer, a photo lithographic mask, etc., by use of a charged beam.

Conventionally, in order to form a circuit pattern on a substrate (e.g., semiconductor wafer, mask, etc.), there have been adopted a method of projecting a pattern in accordance with optical, projection lithography technique or a method of forming any desired pattern by use of a charged beam. In particular, the charged beam pattern drawing apparatus is mainly being used to fabricate, a photo lithographic mask used for the optical projection lithography. In this case, a pattern whose dimensions are four to five times larger than actual pattern dimensions on a wafer are drawn on the mask, under consideration of the reduction ratio of the optical projection lithography apparatus.

Recently, however, since there exists a tendency that the pattern dimensions decrease more and more with the advance of the device microminiaturization, the pattern dimensions are now approaching to the light resolution limit.

To overcome this problem, therefore, an ultra high resolution technique is now being put to practice use. In this technique, the resolution and depth of focus can be improved by improving the conventional photo lithographic mask (e.g., a phase shift mask) and the conventional optical projection system (e.g., modified illumination). In the case where a pattern is formed on wafer in accordance with the ultra high resolution technique, however, when a pattern formed on a mask is projected onto a wafer, there arises a problem in that such a optical proximity effect that the pattern image quality deteriorates becomes prominent. In order to reduce this optical proximity effect, a optical proximity effect correction technique has been proposed as disclosed in Japanese Patent Application Laid-open (Kokai) No. 58-200238 (1983). In this correction technique, as shown in FIG. 1, a plurality (e.g., four) of auxiliary patterns 2 to 5 having a predetermined shape smaller in dimension than a pattern 1 desired to be drawn on a mask (referred to as a desired pattern) are drawn at predetermined positions (e.g., corners or sides) relative to the desired pattern 1 together with the desired pattern 1. Here, the desired pattern 1 to be drawn on the photo lithographic mask implies a pattern enlarged at a predetermined magnification without deformation of a pattern 6 to be formed on a wafer. Further, this magnification is an inverse number of the reduction ratio of the optical projection apparatus.

Further, although the auxiliary patterns 2 to 5 are drawn on the mask in finite dimensions and shape, when the mask pattern is transcribed onto the wafer by the optical projection apparatus, the finite dimensions and shape are no more transcribed onto the wafer and therefore the auxiliary patterns are not actually formed on the wafer. Further, all the auxiliary patterns 2 to 5 are denoted by a comprehensive reference numeral 7 sometimes, hereinafter.

Further, in the following description, the desired pattern and the auxiliary pattern both to be formed on the photo lithographic mask are discriminated from each other in accordance with the above-mentioned definition.

Conventionally, in an electron beam pattern drawing apparatus for making a mask, an acceleration voltage of about 10 KV to 20 kV has been so far adopted. This is because a high resolution is not required for a pattern drawn on the photo lithographic mask, as compared with that required for the pattern formed on the wafer, and further the influence of the proximity effect is small for above acceleration voltage. Here, the scattering range (forward scattering) of the electron beam in resist (which exerts a direct influence upon the resolution) is about 0.1 to 0.2 µm. Further, the resolution of the electron beam apparatus is designed at about 0.1 to 0.2 µm. Therefore, for instance, when the desired pattern size on the wafer is reduced as small as about 0.25 µm, so the pattern size on the photo mask of 1 µm, the acceleration voltage and the beam resolution are both sufficient to draw a desired pattern on the photo lithographic mask. In this case, however, when the pattern dimension of a desired pattern is 1 µm, since the dimension of the auxiliary pattern for compensating for the optical proximity effect is as fine as about 0.25 µm (about ¼ of the pattern dimension of the desired pattern) on the mask, there exists a problem in that the auxiliary pattern cannot be resolved on the mask on the basis of the above-mentioned acceleration voltage and the resolution.

In addition, in the conventional mask fabrication process, when the patterned resist is being developed or after having been developed (i.e., a light shading substance (e.g., Cr)) is etched, a dimension conversion difference is present. Therefore, in order to obtain a desired pattern dimension on the photo lithographic mask after the light shading substance has been etched, pattern drawing data are adjustably processed in such a way that the pattern width can be narrowed or widened under consideration of the dimension conversion difference, In this case, however, when there exist the auxiliary pattern for compensating for the optical proximity effect, since the pattern drawing data are adjustably processed so as to be narrowed under consideration of the dimension conversion difference, there exists a problem in that the auxiliary patterns cannot be formed or lost and thereby disappears.

In addition, in the case where the auxiliary patterns are added to mask pattern exposure data which includes the desired pattern, the number of figures in the mask pattern exposure data is increased. So, there exists a problem that a data amount of mask pattern exposure data is increased.

In addition, in the case where the auxiliary patterns are added to mask exposure data which includes the desired patterns, the number of the figures to be drawn by charged beam exposure apparatus is increased. So, there exists a problem that drawing process speed will become low.

The multi-pass-exposure is adopted to a charged beam exposure method in order to improve pattern positioning accuracy and pattern size accuracy.

In this case, since same patterns are drawn for two times or more than, the above problem becomes more serious by adding the auxiliary patterns to the mask pattern exposure data.

SUMMARY OF THE INVENTION

With these problems in mind, therefore it is the object of the present invention to provide a charged beam pattern drawing method which can draw the auxiliary pattern for compensating for the optical proximity effect, by use of a charged beam pattern drawing apparatus provided with the conventional acceleration voltage and the conventional beam resolution so far used to make a photo lithographic mask.

Further, another object of the present invention is to provide a charged beam pattern exposure method, which can adjustably process the desired pattern or the auxiliary pattern in such a way that the pattern width can be narrowed or widened, even if there exists the auxiliary pattern for compensating for the optical proximity effect.

Further, another object of the present invention is to provide a charged beam exposure method, which can decrease the data amount of mask pattern exposure data which includes both the desired patterns and the auxiliary patterns.

Moreover, further object of the present invention is to provide a charged beam exposure method, which can improve the degradation of throughput of a charged beam exposure apparatus in the case of adopting the multi-pass-exposure, and using the mask pattern exposure data which include both the desired patterns and the auxiliary patterns.

Further, although the present invention will be described in detail with respect to the auxiliary pattern for compensating for the optical proximity effect, the other object of the present invention is to provide a charged beam pattern drawing method, which can draw other auxiliary patterns for the other object at high precision on the photo lithographic mask, when the dimensions of the other auxiliary patterns are smaller than those of the desired pattern.

To achieve the above-mentioned object, the present invention provides a charged beam pattern drawing method of forming a desired pattern related to microscopic pattern on a sample by scanning a charged beam, comprising the steps of: preparing first pattern exposure data related to the desired pattern on a photo lithographic mask, the desired pattern having predetermined angles and sides and obtained by enlarging a shape on a wafer by a predetermined magnification being projected onto the wafer by an optical projection and exposure apparatus; forming second pattern exposure data related to an auxiliary pattern having a predetermined shape and formed on the photo lithographic mask for prevention of the desired pattern from being unclear on the wafer, when the desired pattern on the photo lithographic mask is projected onto the wafer by reducing a size of the desired pattern on the mask by the optical projection and exposure apparatus; discriminating the desired pattern from the auxiliary pattern or vice versa on mask pattern exposure data including both the first pattern exposure data and the second pattern exposure data; and changing charged beam dose ratio of the desired pattern to the auxiliary pattern on the basis of discriminated results, when both the desired pattern and the auxiliary patterns are drawn on the photo lithographic mask by the charged beam.

Further, it is preferable that the method further comprises the steps of: after the step of discriminating the desired pattern from the auxiliary pattern or vice versa on mask pattern exposure data, narrowing or widening the shape of the desired pattern discriminated on the mask pattern exposure data; and drawing the desired pattern and the auxiliary pattern on the mask on the basis of the mask pattern exposure data including both the narrowed or widened desired pattern and the auxiliary pattern, by appropriately changing the dose ratio of the desired pattern to the auxiliary pattern on the basis of the discriminated results, where necessary.

Further, it is preferable that the method further comprises the steps of: after the step of discriminating the desired pattern from the auxiliary pattern or vice versa on mask pattern exposure data, narrowing or widening the shape of the auxiliary pattern discriminated from the mask pattern exposure data, where necessary; and drawing the desired pattern and the auxiliary pattern on the mask on the basis of the mask pattern exposure data including both the desired pattern and the narrowed and widened auxiliary pattern, by appropriately changing the dose ratio of the desired pattern to the auxiliary pattern on the basis of the discriminated results, where necessary.

Further, it is preferable that in the step of drawing a pattern by the charged beam, the auxiliary pattern is discriminated from the mask pattern exposure data on the basis of the discriminated results between the desired pattern and the auxiliary pattern, and the auxiliary pattern is formed by increasing the charged beam dose rate more than that required for the desired pattern.

Further, it is preferable that in the step of drawing a pattern by the charge beam, the auxiliary pattern is discriminated from the mask pattern exposure data on the basis of the discriminated results between the desired pattern and the auxiliary pattern, and the auxiliary pattern is formed by increasing the number of times of the charged beam irradiation more than that required for the desired pattern.

Further, during the pattern drawing, the auxiliary pattern is discriminated on the basis of the pattern exposure data, and only the discriminated auxiliary pattern is drawn by increasing the number of times of pattern irradiation, as compared with the desired pattern.

Further, during the pattern drawing, the auxiliary pattern is discriminated on the pattern exposure data, and only the discriminated pattern is narrowed or widened, before the pattern is drawn on the basis of the pattern exposure data.

The gist of the present invention is as follows: when a desired pattern is drawn on a sample (e.g., photo lithographic mask) by scanning a charged beam; that is, in the method of drawing both a desired pattern and an auxiliary pattern in such a way that any predetermined auxiliary patterns are arranged at any corners or any sides or any positions of the desired pattern, the desired pattern and the auxiliary pattern can be discriminated from each other on the pattern exposure data; the discriminated pattern is processed so as to be narrowed or widened separately from each other; and the desired pattern and the auxiliary pattern are both drawn on the basis of the pattern exposure data after the pattern narrowing and widening processing.

Further, the gist of the present invention is as follows; in the method of drawing both desired patterns and auxiliary patterns in such a way that any predetermined auxiliary patterns are arranged at any corners or any sides or any positions of the desired pattern, the desired patterns and auxiliary patterns can be discriminated from each other on the pattern exposure data; the desired patterns and the auxiliary patterns are defined in separate sections each other on the mask exposure data.

Still furthermore, the gist of the present invention is as follows; in the method of drawing both desired patterns and auxiliary patterns in such a way that any predetermined auxiliary patterns are arranged at any corners or any sides or any positions of the desired pattern, the desired patterns and auxiliary patterns can be discriminated from each other on the pattern exposure data; the desired patterns are drawn by using multi-pass-exposure in the case of drawing the auxiliary patterns; and multi-pass-exposure is not used or the number of drawing is decreased in the case of multi-pass-exposure.

As described above, in the charged beam lithography method according to the present invention, it is possible to form the auxiliary pattern smaller in dimension than the desired pattern in order to compensate for the optical proximity effect. Further, when the desired pattern and the auxiliary pattern are discriminated from each other, even if the narrowing processing is executed for the auxiliary pattern, it is possible to form the auxiliary pattern on a mask without losing the auxiliary pattern.

The data amount of the mask exposure data can be decreased, by defining the desired patterns and the auxiliary patterns separately, and discriminating the desired patterns from the auxiliary patterns or vice versa on mask exposure date.

By discriminating the desired patterns from the auxiliary patterns, only the desired patterns are drawn by multi--pass-exposure method, the auxiliary patterns are drawn by single-pass-exposure method. So, the drawing time can be decreased in the case of adopting multi-pass-exposure to charged beam pattern exposure method.

BRIEF DESCRIPTION OF THE DRAWINGS

In the accompanying drawings:

FIG. 13A is an illustration for assistance in explaining an image in which the pattern exposure data are divided into the desired pattern data, FIG. 13B is an illustration for assistance in explaining an image in which the pattern forming data are divided into the auxiliary pattern data.

FIGS. 14A to 14D are four data flowcharts each for discriminating the auxiliary pattern:

FIGS. 15A and 15B are illustrations for assistance in explaining the pattern exposure data for drawing the auxiliary pattern twice;

FIG. 16 is an illustration for assistance in explaining the method of drawing the auxiliary pattern twice; and FIGS. 17A and 17B are illustations for adopting multi-pass-exposure method of the present invention.

DETAILED DESCRIPTION OF THE PREFERRED EMBODIMENTS

The basic concept of the charged beam pattern exposure method according to the present invention will be described in detail hereinbelow with reference to the attached drawings.

Figure 1:
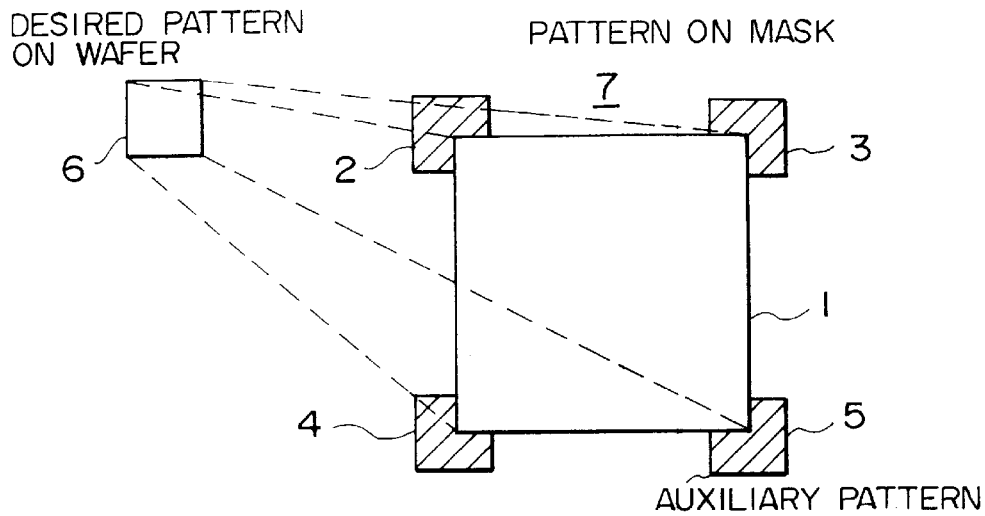
FIG. 1 is an illustration for assistance in explaining the prior art method of forming the auxiliary pattern for compensating for the optical proximity effect.
Figure 2:
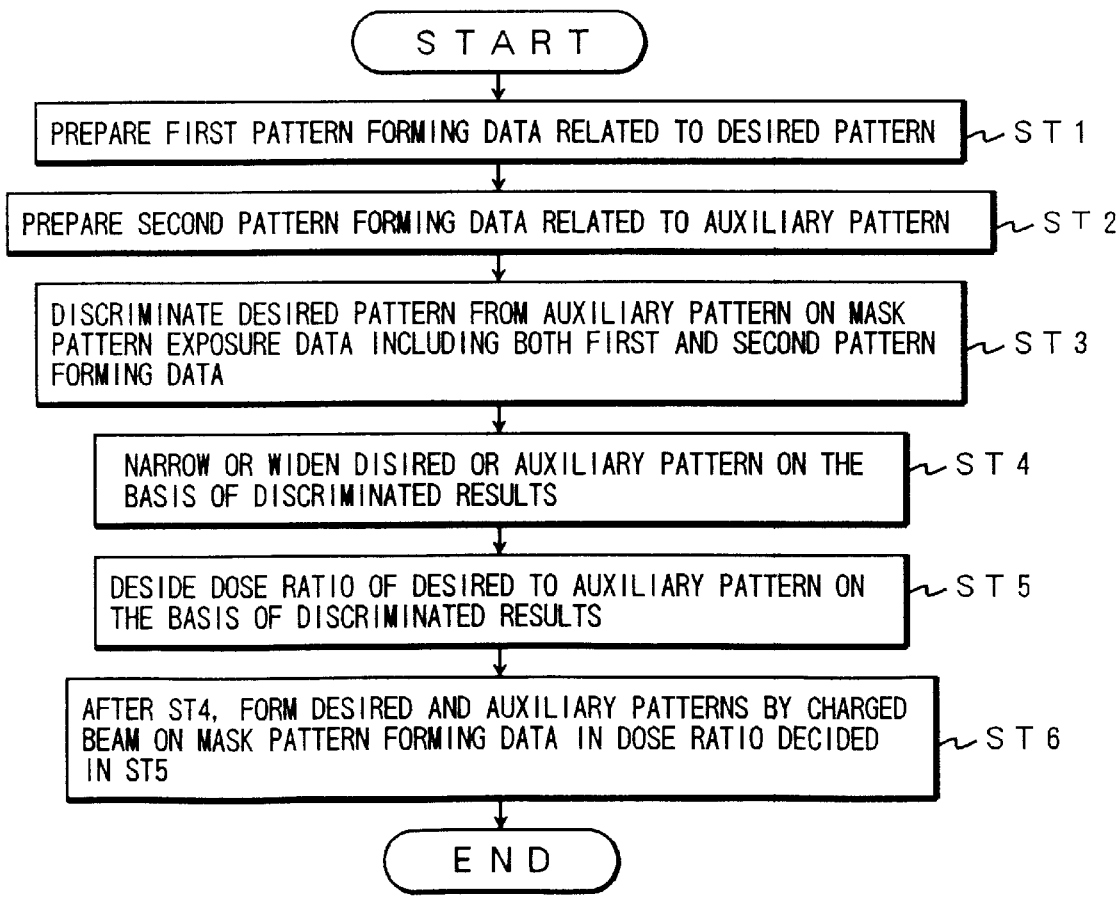
FIG. 2 is a flowchart for assistance in explaining the basic concept of the charged beam pattern drawing method according to the present invention.

FIG. 2 is a flowchart for showing the procedure thereof. As shown in the figure, in step ST1, first pattern exposure data related to a desired pattern are prepared. In step ST2, second pattern exposure data related to an auxiliary pattern are prepared. In step ST3, the desired pattern and the auxiliary pattern are discriminated from each other on mask pattern exposure data including both the first and second pattern exposure data. Further, in step ST6, the desired pattern and the auxiliary pattern are both drawn by a charged beam in accordance with the discriminated results and on the basis of the mask pattern data including both the desired pattern data and the auxiliary pattern data, thus completing the mask pattern drawing process.

In FIG. 2, it is preferable to add a processing step of narrowing or widening the desired pattern or the auxiliary pattern, between the steps ST3 and ST6. In this case, in step ST4, when the processing of narrowing or widening the desired pattern and/or the auxiliary pattern is required, the required pattern or patterns are drawn after having been narrowed or widened, In this process, the narrowing and widening processing can be executed for both or either one of the desired pattern and the auxiliary pattern. In this case, in step ST6, the desired pattern and/or the auxiliary pattern is formed on the basis of the results of the narrowing or widening processing executed in step ST4.

Further, in step ST5, the ratio in dose (exposure) of the charged beam of the desired pattern to the auxiliary pattern is decided. In step ST6, the pattern or patterns are drawn an the basis of the radiation quantity ratio decided in step STS. The charged beam pattern forming method according to the present invention as described above with reference to FIG. 2 is a basic concept of the invention. The method of the present invention will be described in more practical way hereinbelow with reference to the other drawings.

A practical example of the pattern exposure method will be described hereinbelow with reference to FIGS. 3A, 3B, 4A, 4B, 5A and 5B. Here, the reason why the auxiliary pattern for compensating for the optical proximity affect can be formed by use of the prior art charged beam pattern forming apparatus of the conventional acceleration voltage and beam resolution will be first explained.

Figure 3A:
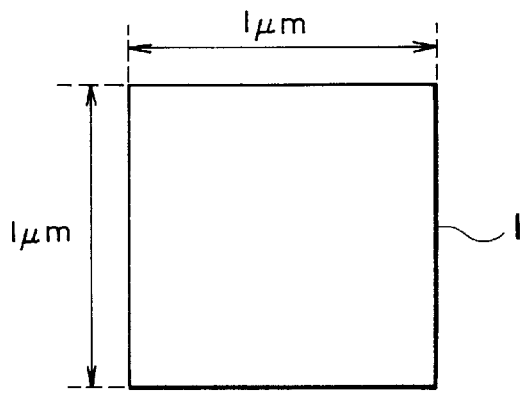
FIG. 3A is an illustration showing a practical example of a desired pattern.
Figure 3B:
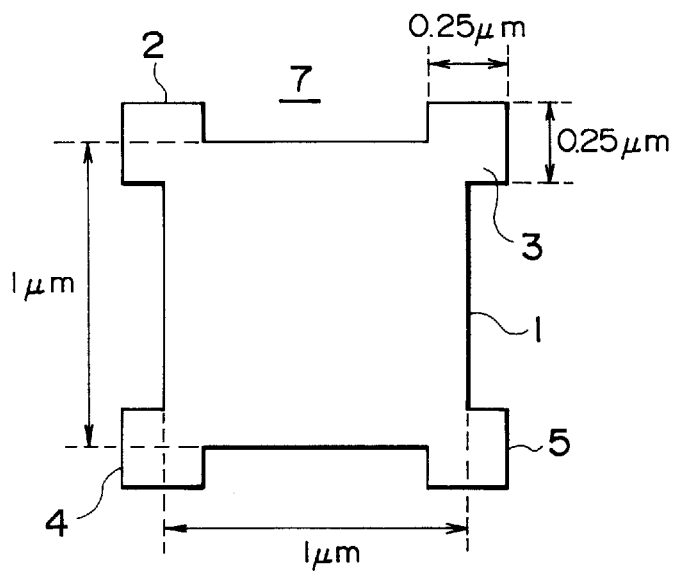
FIG. 3B is an illustration showing a practical example of an auxiliary pattern for compensating for the optical proximity effect additionally drawn on the photo lithographic mask.

FIG. 3A shows an example of a desired pattern 1 required to be drawn on a photo mask, and FIG. 3B is an example of auxiliary patterns 2 to 5 (or 7: a comprehensive reference numeral) for compensating for the optical proximity effect in relation to the desired pattern 1. The dimension of the desired pattern 1 shown in FIG. 3A is 1.0 μm and the dimension of the auxiliary pattern 7 is 0.25 μm.

Figure 4A:
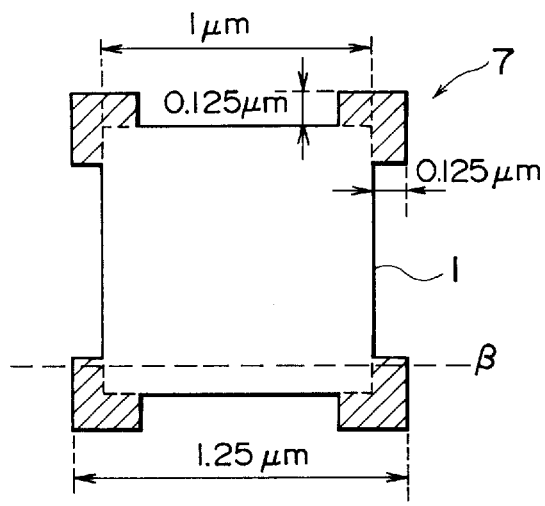
FIG. 4A is an illustration showing a pattern obtained when the auxiliary pattern for compensating for the optical proximity effect is drawn as it is.
Figure 4B:
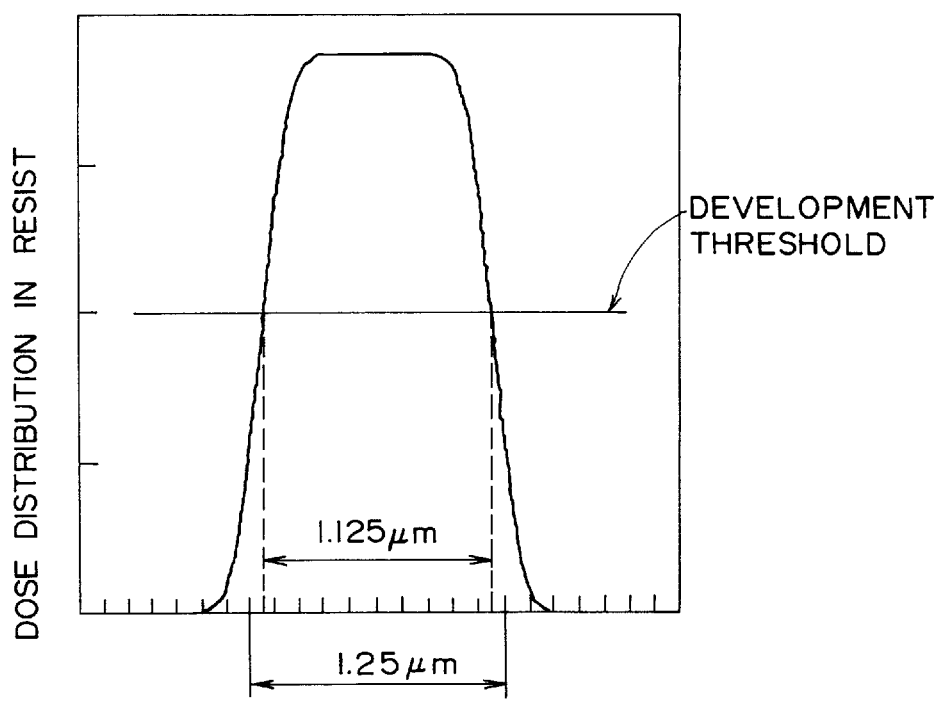
FIG. 4B is a graphical representation for assistance in explaining the reason why the auxiliary pattern cannot be drawn at high precision.

Here, on condition that the acceleration voltage of the charged beam pattern forming apparatus is 15 kV and thereby the forward scattering range is about 0.15 μm and further that the beam resolution of the pattern forming apparatus is 0.15 μm, the resist dose distribution shown in FIG. 4B along a dashed line β as shown in FIG. 4A will be taken into consideration in both the desired pattern 1 and the auxiliary pattern 7 both shown in FIG. 4A. In the normal pattern drawing process, the resist dose distribution can be expressed as shown in FIG. 4B. In FIG. 4E, when a development threshold value is set, the dimension along the dashed line β becomes 1.125 μm, in spite of the fact the required dimension along the dashed line β is 1.25 μm. In other words, the auxiliary pattern 7 is narrowed down to 1.125 μm, as compared with the desired pattern of 1.25 μm.

Figure 5A:
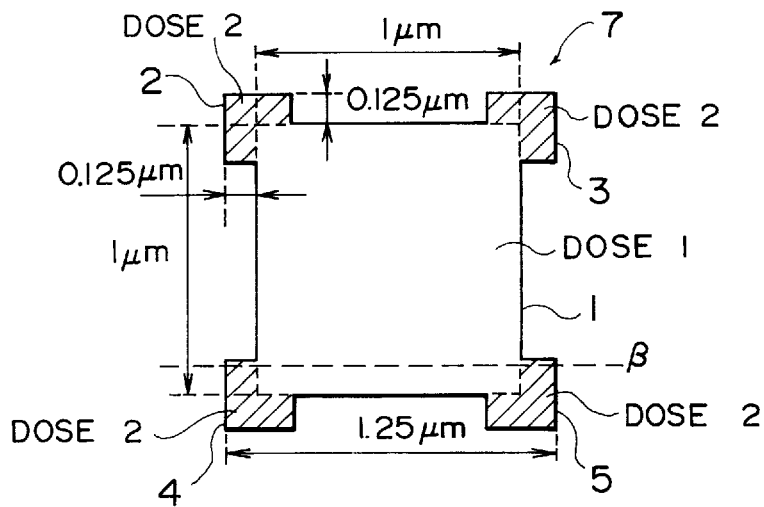
FIG. 5A is an illustration showing a pattern obtained when the auxiliary pattern for compensating for the optical proximity effect is drawn in accordance with the method according to the present invention.
Figure 5B:
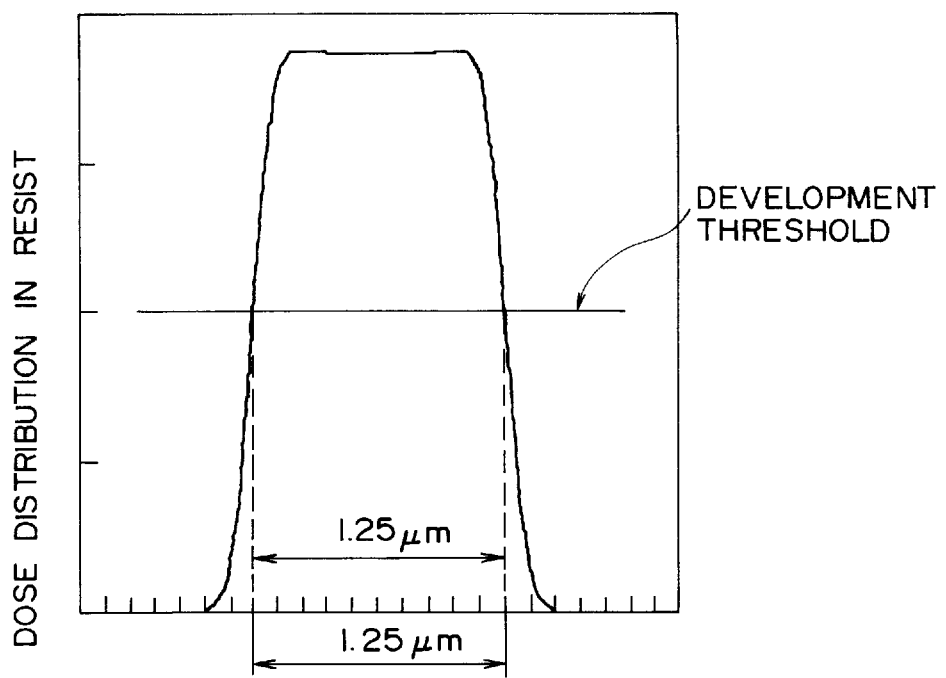
FIG. 5B is a graphical representation for assistance in explaining the reason why the auxiliary pattern can be drawn at high precision.

In addition, when the auxiliary pattern is small, there exists the case where the auxiliary pattern cannot be formed. Here, the following case as shown in FIG. 5A will be taken into consideration: the desired pattern is formed at a first dose level 1 and the auxiliary pattern is formed at a second dose level 2, by way of example. The dose distribution in the resist along the dashed line β is shown in FIG. 5B. Here, the assumption is made that as shown in FIG. 5B the dimension of 1.25 μm can be obtained along the dashed line β at the development threshold (the same as with the case shown in FIG. 4B). In this case, the auxiliary pattern 7 can be formed as indicated by the desired dimension. In other words, it is possible to adjustably form the auxiliary pattern as indicated by the dimension, by increasing the dose so that the exposure of the auxiliary pattern exceeds the development threshold or repeating the same pattern drawing several times.

Figure 6A:
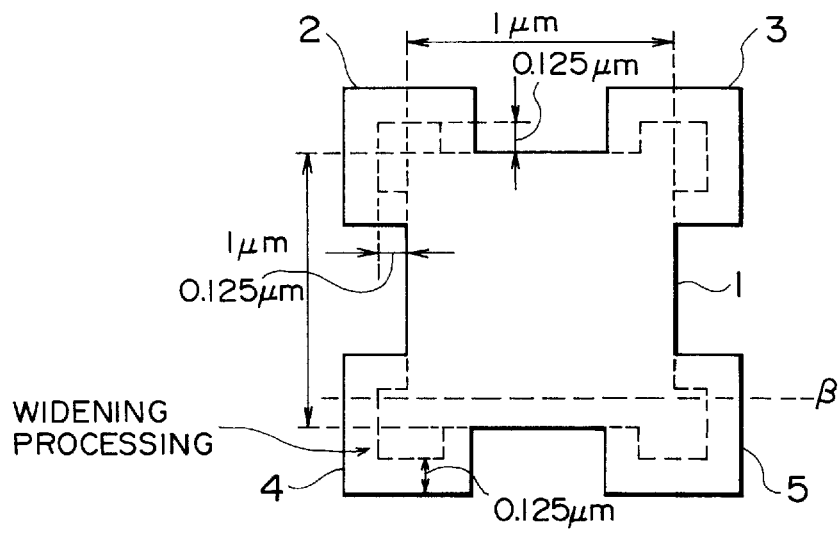
FIG. 6A is an illustration showing another pattern obtained when the auxiliary pattern for compensating for the optical proximity effect is drawn in accordance with the method according to the present invention.
Figure 6B:
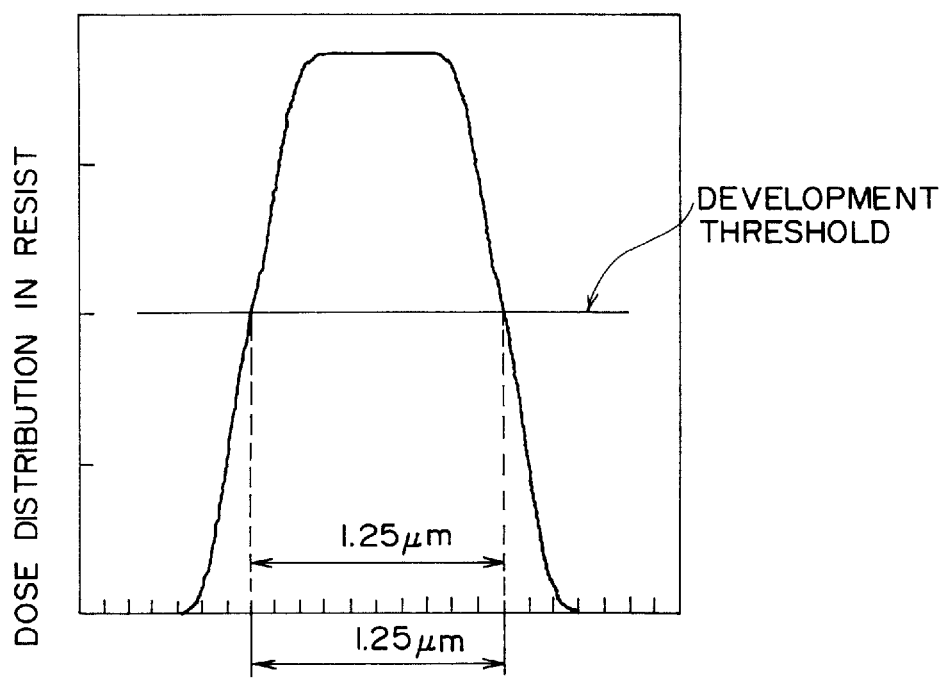
FIG. 6B is a graphical representation for assistance in explaining the reason why the auxiliary pattern can be drawn at high precision.

Further, the reason why the auxiliary pattern for compensating for the optical proximity effect can be formed as indicated by the desired dimension by widening the dimension of the auxiliary pattern will be described hereinbelow. Here, in the desired pattern and the auxiliary pattern as shown in FIG. 4A, the resist radiation quantity distribution along a dashed line β shown in FIG. 4A will be taken into consideration. In the normal pattern drawing process, the resist dose distribution can be expressed as shown in FIG. 4B, with the result that the dimension of the auxiliary pattern is narrowed as already explained. However, when the auxiliary pattern is formed by widening the dimension by 0.125 μm as shown in FIG. 6A, the radiation quantity distribution in the resist along the dashed line β becomes as shown in FIG. 6B, with the result that it is possible to form the auxiliary pattern roughly as indicated by the desired dimension.

Further, the reason why the auxiliary pattern for compensating for the optical proximity effect can be formed without being lost or disappearance, even when the auxiliary patter is processed so as to be narrowed, will be described hereinbelow.

Figure 7A:
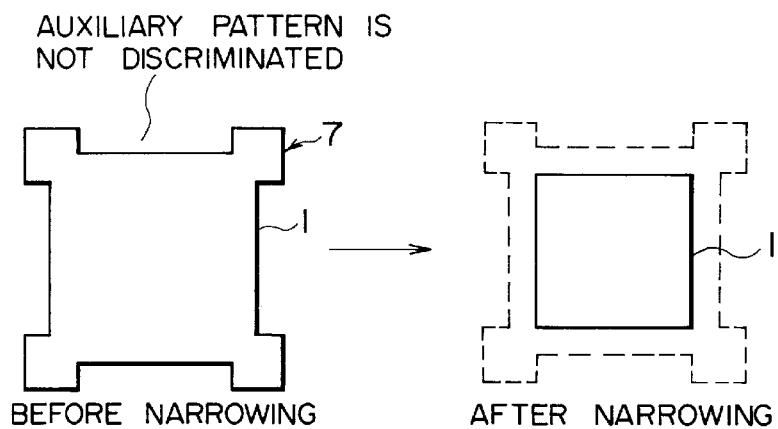
FIGS. 7A to 7C are illustrations for assistance in explaining the method of processing the pattern into a narrower width in accordance with the method according to the present invention, in comparison with the prior art method.
Figure 7B:
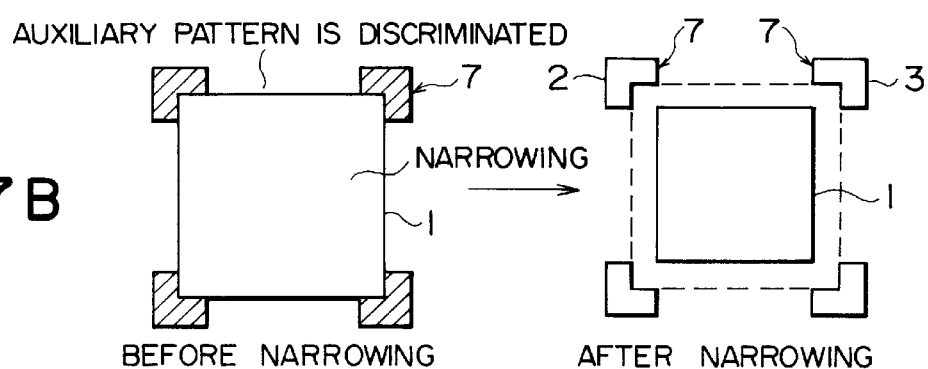
Figure 7C:
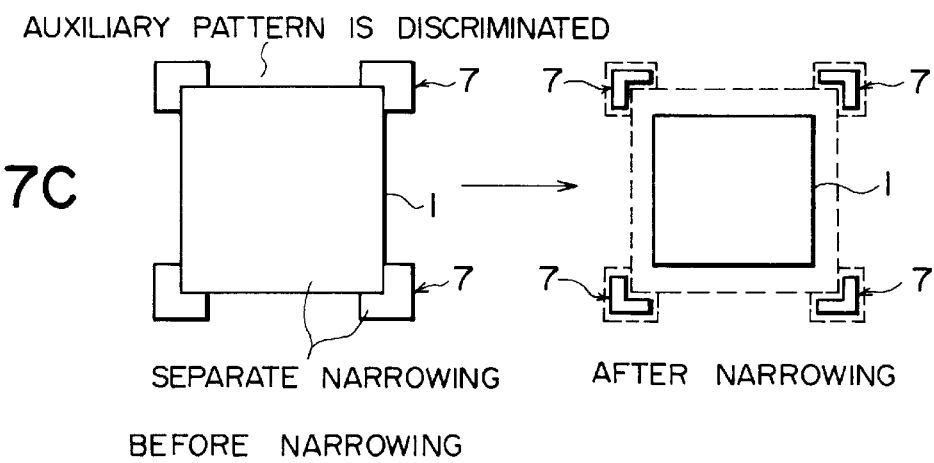

Here, when the auxiliary pattern as shown in FIG. 3B is narrowed as it is to eliminate the dimension conversion difference of 0.2 μm caused by the development or the etching of light shading substance, the auxiliary pattern is lost and thereby disappears as shown in FIG. 7A. Here, however, as shown in FIG. 7B, when the desired pattern is discriminated from the auxiliary pattern and further when the narrowing processing is executed for only the desired pattern, it is possible to prevent the auxiliary pattern from disappearing. Further, as shown in FIG. 7C, when the narrowing processing is necessary for the auxiliary pattern, it is possible to execute the narrowing processing for only the auxiliary pattern by an appropriate rate, independently from the narrowing processing of the desired pattern.

Figure 8:
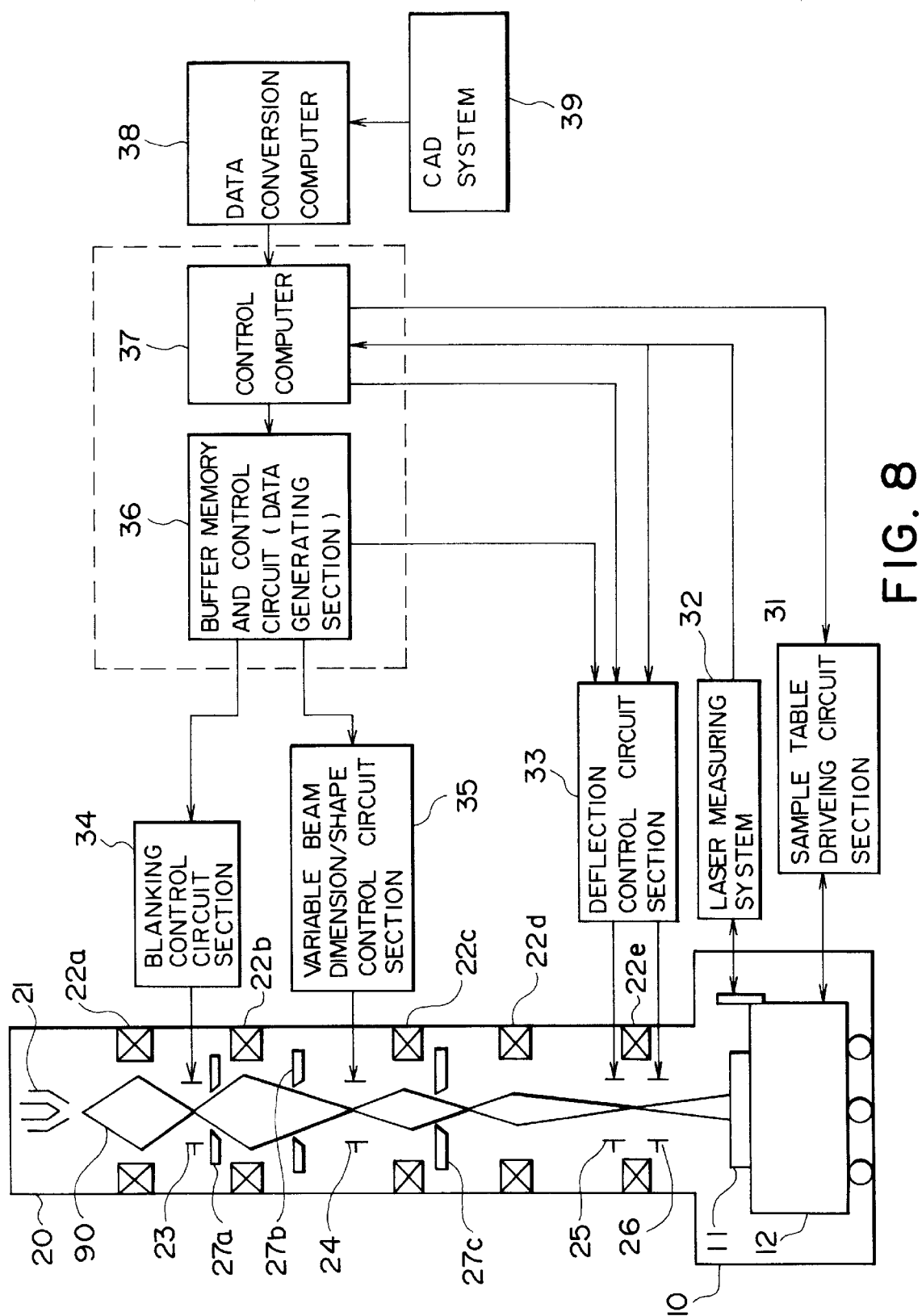
FIG. 8 is a schematic block diagram showing an electron beam exposure apparatus adopted for the method according to the present invention.

FIG. 8 shows an electron beam pattern exposure apparatus, to which the method according to the present invention is applied. In the drawing, there are shown a sample chamber 10, a target (sample) 11, a sample table (stage) 12, an electron optical system 20, an electron gun 21, lens systems 22a to 22e, deflectors 23 to 26, a blanking deflector 27a, a first shaping aperture mask 27b, and a second shaping aperture mask 27c. In addition, in FIG. 8, there are shown a sample table driving circuit section 31, a laser measurement system 32, a deflection control circuit section 33, a blanking control circuit section 34, a variable shaped beam dimension and shape control circuit section 35, a buffer memory and control circuit (data generating section) 36, a control computer 37, a data conversion computer 38, and a CAD system.

An electron beam emitted from the electron gun 21 is on/off controlled by the blanking deflector 23. The apparatus can change the exposure dose for each radiation position by adjusting the ON/OFF radiation time of the electron beam. The beam passing through the blanking deflector 27a is shaped into a rectangular beam by the beam shaping deflector 24 and the beam shaping aperture masks 27b and 27c. The size of the rectangular beam is changed by the beam shaping aperture masks 27b and 27c. The shaped beam is deflected/scanned on the target 11 by the scanning deflectors 25 and 26. With this beam scanning, desired patterns are drawn on the target 11. Further, the design data edited by the CAD system 39 are converted into data (referred to as pattern exposure data) by the data conversion computer 38 and then inputted to the electron beam pattern exposure apparatus. The converted pattern exposure data are stored in a pattern exposure data storing disk incorporated in the control computer 37.

Figure 9:
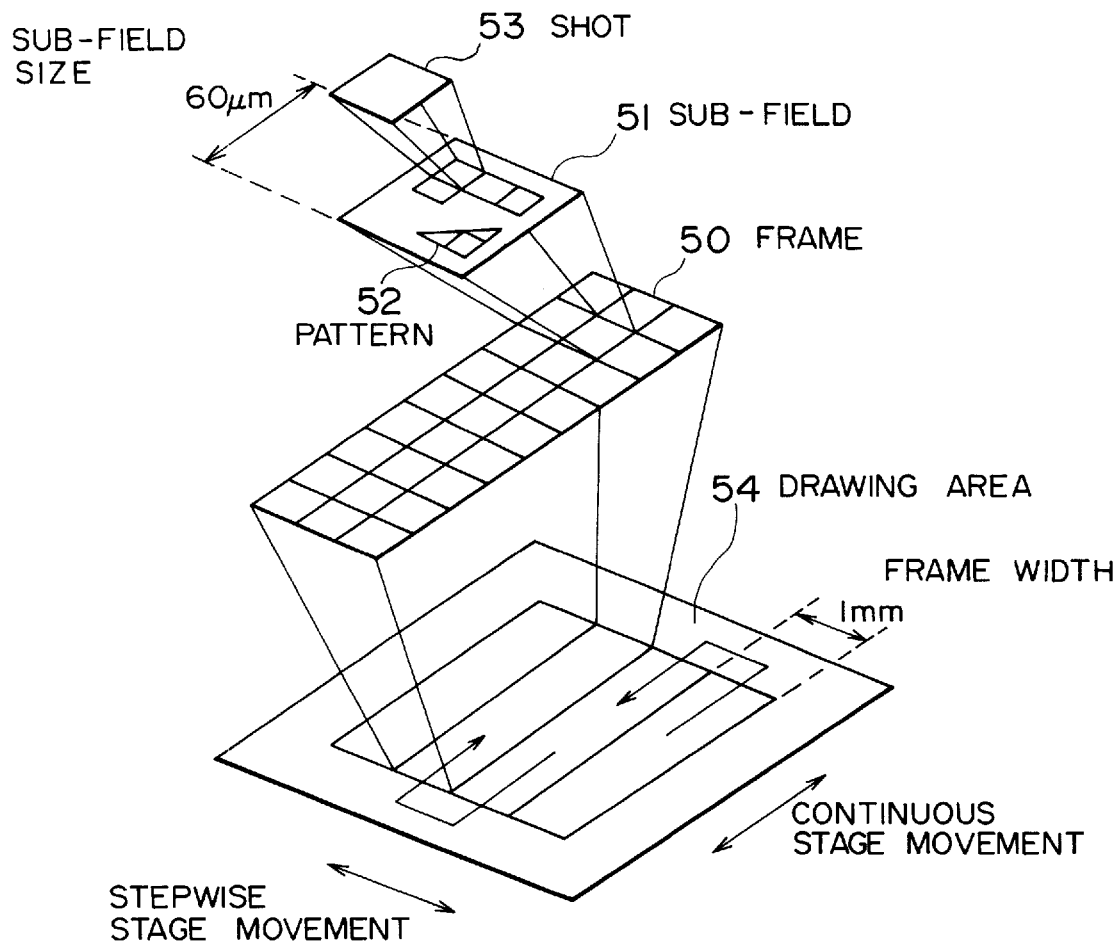
FIG. 9 is an exploded view showing the exposure data structure used for the electron beam exposure apparatus adopted for the method according to the present invention.

In the electron beam pattern exposure apparatus as described above, the pattern exposure data are constructed in such a way that all the pattern drawing area are divided into a frame 50 and a sub-field 51, as shown in FIG. 9. In FIG. 9, the stage is moved continuously in the longitudinal direction of the frame 50, and the sub-field 51 is located in position by scanning the beam by the main deflector 26 in the direction perpendicular to the longitudinal direction of the frame 50. The size (i.e., frame width) in the direction perpendicular to the longitudinal direction of the frame is 1 mm, which can be obtained by scanning the electron beam by the main deflector 26. The sub-field is scanned by deflecting the electron beam by the sub-deflector 25. The sub-field size is 60 μm×60 μm, which can be obtained by scanning the electron beam by the sub-deflector 25. Further, in FIG. 9, a pattern 52 existing in the sub-field 51 is divided into unit figures (for each shot) 53 by the control circuit 36.

When the control computer 37 is started for pattern drawing, the pattern exposure data are transferred to a buffer memory of the control circuit 36 in sequence for each frame, and further various control circuit sections 31 or 35 are started. Using the frame data, the control circuit 36 calculates the main deflection position, the sub-deflection position, the shot division, the shot shaping and sizing, the irradiation time, etc. The calculated main deflector position and the sub-deflector position are transferred to the deflection control circuit 33, and then compared with the stage coordinates measured by the laser measuring system, to decide the deflection value by executing various correcting calculations. The shot shaping and sizing data are transferred to the dimension control circuit section 35 to decide the shaping deflection position. The irradiation time is transferred to the blanking control circuit section to control the unblanking time, that is, to control the beam irradiation time. The respective deflection values are converted into analog values by a digital/analog converter. Therefore, when various calculated voltages are applied to the respective deflectors, it is possible to draw any desired pattern at any desired positions.

Figure 10A:
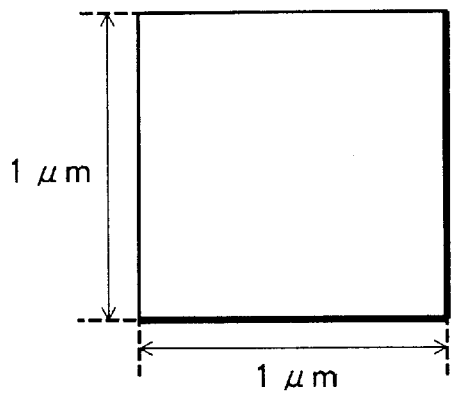
FIGS. 10A and 10B are illustrations for assistance in explaining the method of defining the pattern data used for the method according to the present invention.
Figure 10B:
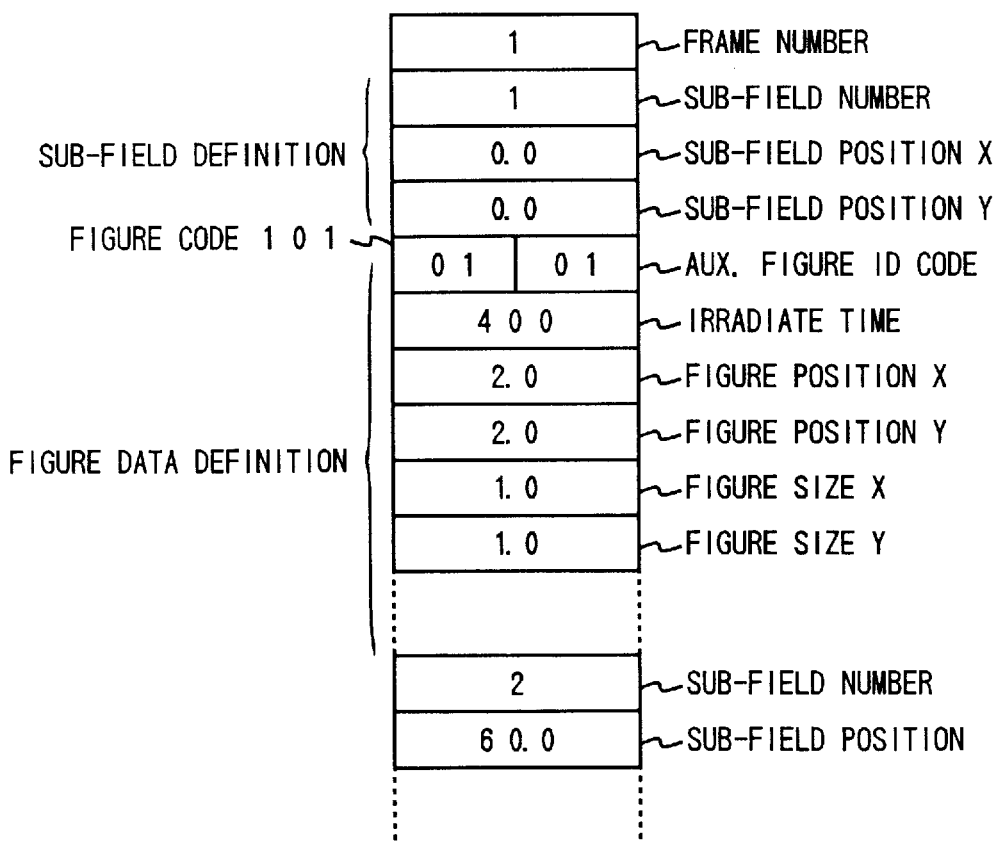
Figures 11, 12:
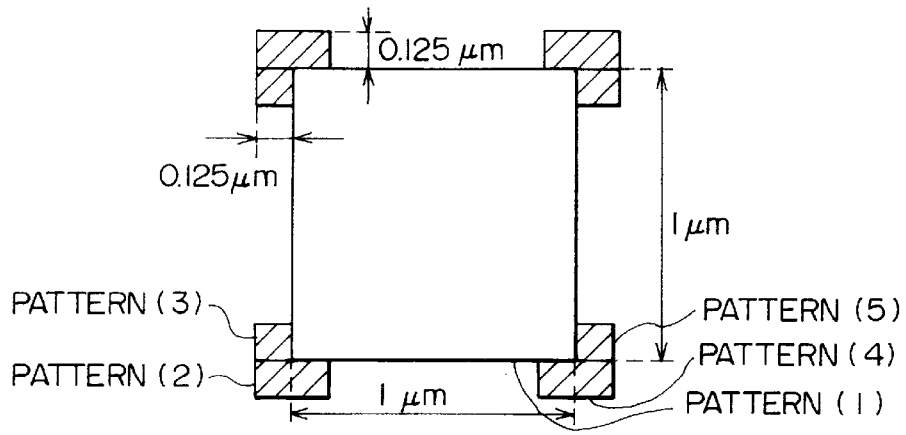
FIG. 11 is an illustration showing the desired pattern and the auxiliary pattern for compensating for the optical proximity effect both used for the method according to the present invention.
FIG. 12 is an illustration for assistance in explaining the patten exposure data having auxiliary pattern identification data for the pattern shown in FIG. 11.

There is described a fourth embodiment of the present invention. On the basis of a practical data example used for the pattern exposure method according to the present invention, a method of deciding the shape and size of a pattern and a method of defining the pattern on the pattern forming data according to the fourth embodiment will be explained hereinbelow with reference to FIGS. 10A and 10B. In FIG. 10B, a figure code is denoted by 101. Further, FIG. 11 shows a desired pattern and an auxiliary pattern (four corner patterns) for compensating for the optical proximity effect attached to the desired pattern. The feature of the present invention is to discriminate both the desired pattern and the auxiliary pattern as shown in FIG. 11 by use of identification codes (referred to as ID codes) 102 as shown in FIG. 12. In FIG. 12, a code 01 denotes the desired pattern and a code 02 denotes an auxiliary pattern.

In this embodiment, although the desired pattern and the auxiliary pattern are discriminated from each other by use of the ID codes, without being limited only thereto, it is possible to appropriately modify the pattern forming data themselves in such a way that the desired pattern and the auxiliary pattern can be discriminated from each other, as shown in FIGS. 13A and 13B. In the case shown in FIGS. 13A and 13B, the pattern exposure data 1 shown in FIG. 13A denotes the desired pattern exposure data, and the pattern exposure data 2 shown in FIG. 13B denotes the auxiliary pattern exposure data. Therefore, when the pattern exposure data 1 and 2 are used and further when the pattern exposure data 2 are designated as the auxiliary pattern by use of the control computer 37, it is possible to discriminate the desired pattern from the auxiliary pattern or vice versa.

Figure 13C:
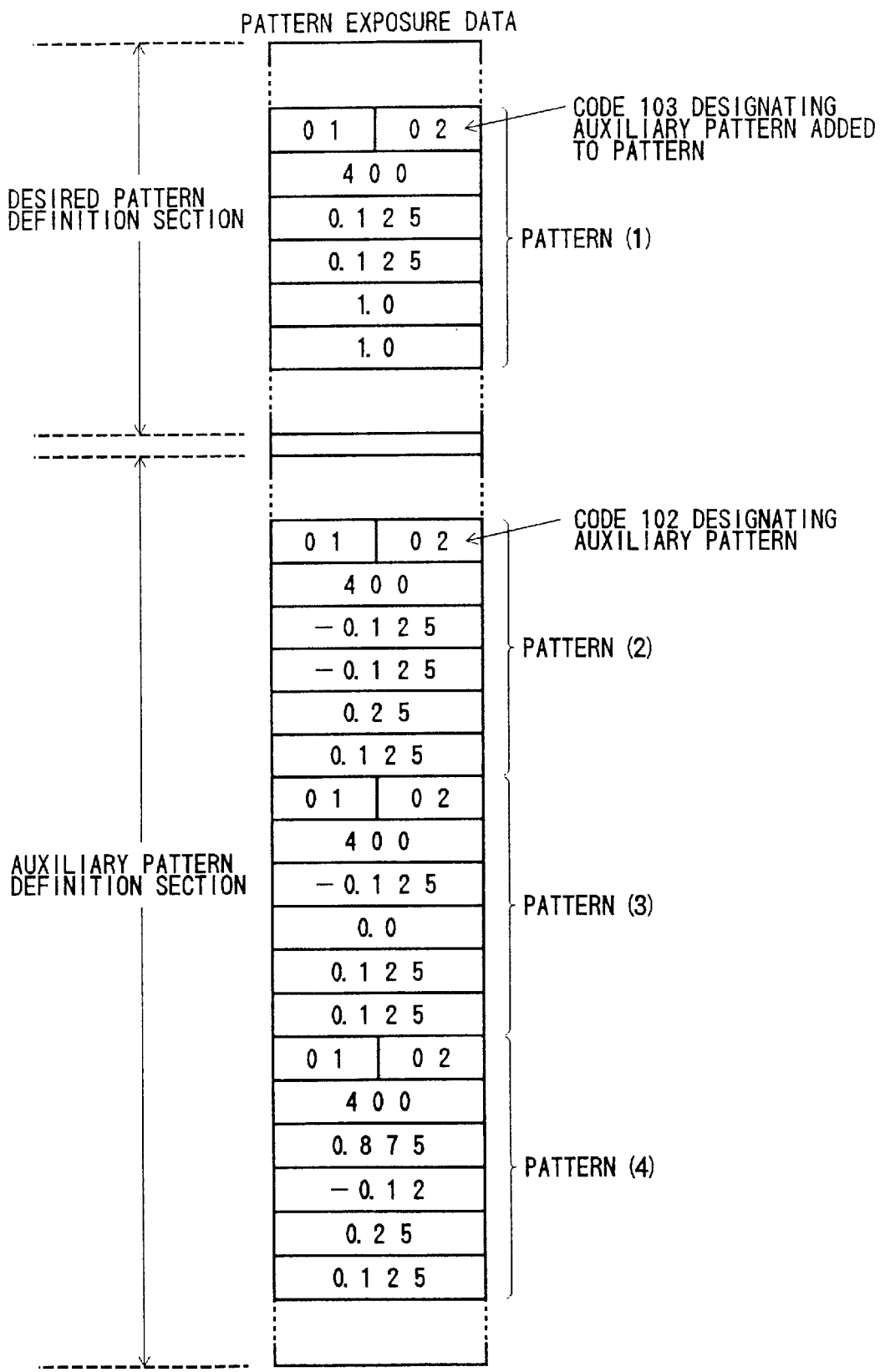
FIG. 13C is an illustration for assistance in explaining a definition of a desired pattern and auxiliary pattern.

As shown in FIG. 13C, one mask pattern exposure data comprises the section of defining the desired patterns and the section of defining the auxiliary patterns. In FIG. 13C, the code 103 is defined, which points the auxiliary pattern, on the section of defining the desired patterns. Since the desired patterns and the auxiliary patterns are defined in separate sections on mask pattern exposure data, the desired patterns or the auxiliary patterns can be discriminated on mask pattern exposure data at the control computer.

The auxiliary patterns are required for being defined for each figure of the desired pattern. So, the auxiliary pattern are defined N times for N desired pattern. The auxiliary patterns are defined as shown in FIG. 13C, the auxiliary patterns are defined only 1 time, and the times of defining auxiliary patterns is independent of the number of desired patterns. So, the data amount of the mask exposure data can be decreased.

The procedure flow of discriminating the desired pattern from the auxiliary pattern for compensating for the optical proximity effect or vice versa will be described hereinbelow with reference to FIGS. 14A to 14C. Here, as shown in FIG. 14A, the design (CAD) data 41 are converted into mask pattern exposure data 43 by a data conversion system 42 and then supplied to the pattern forming apparatus 44. Further, as shown in FIG. 14B, before converted into the mask pattern exposure data 43A, it is possible to execute the optical proximity effect compensation 45. In this case, different ID codes as shown in FIG. 12 are attached to the desired pattern and the auxiliary pattern generated by the compensation processing, respectively; and after the pattern exposure data have been converted, the mask exposure data including both the desired pattern and the auxiliary pattern are to be prepared. Further, in the case of the processing flowchart as shown in FIG. 14C, after two pattern exposure data 43B and 43C as shown in FIG. 13B have been prepared, these two data 43B and 43C are used as the mask pattern exposure data 43D are to draw the mask pattern.

In the case of the processing flowchart as shown in FIG. 14D, the mask pattern exposure data 43E is prepared which includes the desired patterns and auxiliary patterns in the separate section. The mask pattern exposure data is used for drawing.

FIG. 12 shows an example of the desired pattern and the auxiliary pattern of the pattern exposure data, which are both discriminated by the ID codes, respectively in the fourth embodiment. In FIG. 12, the auxiliary pattern ID code is defined by 102. Therefore, when this identification code 102 is 02, the pattern drawing control circuit (data generating section) 36 discriminates that the pattern is the auxiliary pattern on the basis of this ID code 02. On the other hand, when this identification code 102 is 01, the pattern drawing control circuit (data generating section) 36 discriminates that the pattern is the desired pattern. As describe above, it is possible to discriminate the desired pattern from the auxiliary pattern or vice versa.

Next, there is described a pattern drawing method according to a fifth embodiment of the present invention. In the fifth embodiment, the desired pattern and the auxiliary pattern were discriminated in accordance with the ID codes as explained in the fourth embodiment, and further the auxiliary pattern was formed in a dose rate two times higher than that of the desired pattern as shown in FIG. 6A. In this case, the dose ratio of the auxiliary pattern to the desired pattern can be determined appropriately according to the various conditions such as the beam resolution, forward scattering range, resist, process, pattern shape and dimensions, etc. In the fifth embodiment, the desired pattern was irradiated at 4 $\mu C/cm^2$, and the auxiliary pattern was irradiated at 8 $\mu C/cm^2$.

In the case where the beam current density is 10 $A/cm^2$, the irradiation times are 400 nsec and 800 nsec, respectively. In the data as shown in FIG. 12, the irradiation times are determined by irradiation time (in unit of nanosecond). The irradiation times can be determined in the pattern exposure data as with the case of the fifth embodiment. However, it is possible to determine the dose rate (irradiation time) of the auxiliary pattern or the dose ratio of the auxiliary pattern to the desired pattern by the control computer 37 as the pattern exposure data, and then set the determined quantity rate or ratio to the data generating section 36. In this case, the data generating section 36 discriminates whether the pattern is the auxiliary pattern or not on the basis of the ID code, and draws the desired pattern and the auxiliary pattern, respectively by changing the irradiation time according to the pattern.

In the fifth embodiment, since the dose ratio of the auxiliary pattern to the desired pattern is determined two, the exposure quantity distribution becomes as shown in FIG. 5B, and the auxiliary pattern can be formed at the development threshold value.

Next, there is described a sixth embodiment of the present invention. Even though the desired pattern and the auxiliary pattern were discriminated in accordance with the ID codes as explained in the fourth embodiment, the desired pattern as shown in FIG. 16 may be drawn by a single irradiation, and the auxiliary pattern was drawn by two irradiation times in sixth embodiment. In this case, as shown in FIG. 15A, it is possible to define the desired pattern as single irradiation and the auxiliary pattern as two irradiation times, both on the mask exposure data. Further, as shown in FIG. 15B, it is possible to first define both the desired and auxiliary patterns as single irradiation. After that, only when the auxiliary pattern has been discriminated by the data generating section on the basis of the ID code, it is possible to control only the discriminated auxiliary pattern so as to be irradiated twice. In the sixth embodiment, although the auxiliary pattern is irradiated twice, an optimum number of irradiation times can be determined according to the various conditions such as the beam resolution, forward scattering, resist, process, pattern shape and dimensions, etc.

In the sixth embodiment, the irradiation quantity at one time was 4 $\mu C/cm^2$. In this case, since the auxiliary pattern was irradiated at 8 $\mu C/cm^2$, the exposure dose distribution becomes as shown in FIG. 15B, so that the auxiliary pattern can be formed at the development threshold.

There is described a seventh embodiment of the present invention. The data obtained after the light proximity effect compensation has been completed in FIG. 14B or 14C are constructed as shown in FIG. 12 or 13B, that is, in such a way that the auxiliary pattern can be discriminated. The data as shown in FIG. 12 are inputted and then converted. Further, the desired pattern and the auxiliary pattern are discriminated on the basis of the ID codes by the data converting system. Further, when only the desired pattern is process so as to be narrowed, the pattern exposure data as shown in FIG. 7B can be obtained. Further, when the auxiliary pattern is also process so as to be narrowed, the mask exposure data as shown in FIG. 7C can be obtained. Further, when there are two pattern exposure data 1 and 2 as shown in FIGS. 13A and 13B, it is possible to obtain the mask exposure data as shown in FIGS. 7B and 7C, by changing the conditions of the narrowing processing whenever the pattern exposure data 1 and the pattern exposure data 2 are converted.

Further, when the narrowing processing is not executed by the data conversion system, it is possible to execute the narrowing processing by discriminating the desired pattern from the auxiliary pattern or vice versa by the data generating section 36.

Next, there is described an eighth embodiment of the present invention. The data obtained after the optical proximity effect compensation has been completed in FIGS. 14B and 14C are constructed as shown in FIG. 12 or 13B, that is, in such a way that the auxiliary pattern can be discriminated. The data as shown in FIG. 12 are inputted and then converted. Further, the desired pattern and the auxiliary pattern are discriminated on the basis of the ID codes by the data conversion system. Further, when only the desired pattern is process so as to be widened, the mask exposure data as shown in FIG. 6A can be obtained. Further, when there are two pattern exposure data 1 and 2 as shown in FIGS. 13A and 13B, it is possible to obtain the mask exposure data as shown in FIG. 6A, by executing the widening processing when the pattern exposure data 2 are converted. Further, when the auxiliary pattern is widened by 0.125 $\mu m$ by the widening processing, the exposure dose distribution as shown in FIG. 6B can be obtained, so that it is possible to form the auxiliary pattern at a high precision.

Further, when the widening processing is not executed by the data converting system, it is possible to execute the widening processing by discriminating the desired pattern from the auxiliary pattern or vice versa by the data generating section 36.

Next, there is described a pattern drawing method according to ninth embodiment of present invention. The exposure data 1 (43B) and the exposure data 2 (43C) as shown in FIG. 14C is used for drawing adopting multi-pass-exposure. N times drawing is carried out.

The exposure data 1 and the exposure data 2 are used for 1st drawing. Only the exposure data 1 is used for from 2nd to N-th drawing. The dose of the auxiliary patterns which defined in the exposure data 2 is more than N times of dose of the desired pattern which defined in the exposure data 1.

FIG. 17A shows the case of without discrimination of the desired patterns and the auxiliary patterns, 9×N shots are required for drawing the figure shown in FIG. 17A.

FIG. 17B shows the case of with discrimination of the desired patterns and the auxiliary patterns, and N times multi-pass-drawing. In this case, {9+(N+1)} shots are required for drawing the figure shown in FIG. 17B.

The method according to the present invention is not limited only to the above-mentioned embodiments. For instance, the above-mentioned fourth to eighth embodiments can be combined with each other. Further, although the above-mentioned embodiments have been described by taking the case of the electron beam pattern exposure apparatus as an example of the charged beam pattern exposure apparatus, it is of course possible to apply the method according to the present invention to a laser beam pattern exposure apparatus or an ion beam pattern exposure apparatus, on the basis of various and appropriate modifications without departing the spirit of the invention.

Further, the method and apparatus according to the present invention have been described in relation to the compensation pattern for compensating for the optical proximity effect. Without being limited only thereto, as far as the auxiliary pattern dimension is smaller than that of the desired pattern, the gist of the present invention can be applied to other auxiliary patterns for other objects by appropriate modifications.

What is claimed is:

1. A charged beam lithography method employing scanning of a charged beam, comprising the steps of:

obtaining first pattern exposure data related to a desired pattern to be formed on a photo lithographic mask, the desired pattern having a predetermined angles and sides and obtained by enlarging a shape on a wafer by a predetermined magnification being projected onto the wafer by an optical projection and exposure apparatus, and said first pattern exposure data having a first predetermined drawing condition when an electron beam drawing apparatus draws a pattern on the mask;

obtaining second pattern exposure data related to an auxiliary pattern having a predetermined shape to be formed on the mask for prevention of the desired pattern from being unclear on the wafer when the desired pattern on the mask is projected onto the wafer due to a reduction in the size of the desired pattern on the mask by the optical projection and exposure apparatus, and said second pattern exposure data having a second predetermined drawing condition when the electron beam drawing apparatus draws the pattern on the mask, said second predetermined drawing condition being different from said first predetermined drawing condition;

forming mask pattern exposure data by combining said first and second pattern exposure data, such that discrimination is possible between said first and second pattern exposure data;

drawing a pattern using a charged beam lithography apparatus having a function for discriminating at least one of said desired pattern and auxiliary pattern from said mask exposure data including said first and second patterns and capable of discriminating said first and second patterns;

discriminating the desired pattern from the auxiliary pattern or vice versa based on said mask pattern exposure data comprising both the first pattern exposure data and the second pattern exposure data to produce discriminated results; and setting a charged beam dose ratio of the desired pattern to the auxiliary pattern on the basis of the discriminated results for use when both the desired pattern and the auxiliary pattern are drawn on the mask by the charged beam.

2. The charged beam lithography method of claim 1, further comprising the steps of:

after the step of discriminating the desired pattern from the auxiliary pattern or vice versa, narrowing or widening the shape of the desired pattern; and drawing the desired pattern and the auxiliary pattern on the mask on the basis of the mask pattern exposure data including both the desired pattern that has been narrowed or widened and the auxiliary pattern, by appropriately changing the dose ratio of the desired pattern to the auxiliary pattern on the basis of the discriminated results, where the desired pattern and auxiliary pattern can be discriminated by having different drawing conditions.

3. The charged beam lithography method of claim 1, further comprising the steps of:

after the step of discriminating the desired pattern from the auxiliary pattern or vice versa, narrowing or widening the shape of the auxiliary pattern discriminated from the mask pattern exposure data, where the desired pattern and auxiliary pattern can be discriminated by having different drawing conditions; and forming the desired pattern and the auxiliary pattern on the mask on the basis of the mask pattern exposure data including both the desired pattern and the auxiliary pattern that has been narrowed or widened, by appropriately changing the dose ratio of the desired pattern to the auxiliary pattern on the basis of the discriminated results, where the desired pattern and auxiliary pattern can be discriminated by having different drawing conditions.

4. The charged beam lithography method of claim 1, wherein, the auxiliary pattern is discriminated from the mask pattern exposure data on the basis of the discriminated results between the desired pattern and the auxiliary pattern, and the auxiliary pattern is drawn by increasing the charged beam dose rate more than that of the desired pattern.

5. The charged beam lithography method of claim 1, wherein, the auxiliary pattern is discriminated from the mask pattern exposure data on the basis of the discriminated results between the desired pattern and the auxiliary pattern, and the auxiliary pattern is drawn by increasing the number of times of charged beam irradiation more than that of the desired pattern.

6. The charged beam lithography method of claim 1, wherein, the desired pattern is discriminated from mask pattern exposure data on basis of the discriminated results between the desired pattern and the auxiliary pattern, and the auxiliary pattern is drawn employing multi-pass-exposure.

* * * * *